United States Patent
Stoner et al.

(10) Patent No.: US 9,136,794 B2
(45) Date of Patent: Sep. 15, 2015

(54) BIPOLAR MICROELECTRONIC DEVICE

(75) Inventors: Brian Stoner, Durham, NC (US);
Jeffrey Piascik, Cary, NC (US)

(73) Assignee: Research Triangle Institute, International, Triangle Park, NC (US)

( * ) Notice: Subject to any disclaimer, the term of this patent is extended or adjusted under 35 U.S.C. 154(b) by 0 days.

(21) Appl. No.: 14/116,111

(22) PCT Filed: Jun. 21, 2012

(86) PCT No.: PCT/US2012/043574
§ 371 (c)(1),
(2), (4) Date: Nov. 6, 2013

(87) PCT Pub. No.: WO2012/177900
PCT Pub. Date: Dec. 27, 2012

(65) Prior Publication Data
US 2014/0104013 A1    Apr. 17, 2014

Related U.S. Application Data

(60) Provisional application No. 61/499,783, filed on Jun. 22, 2011.

(51) Int. Cl.
*H01J 49/00* (2006.01)
*H03C 1/16* (2006.01)
(Continued)

(52) U.S. Cl.
CPC . *H03C 1/16* (2013.01); *H01J 49/14* (2013.01); *H01J 49/26* (2013.01); *H01J 49/408* (2013.01); *H01J 49/4215* (2013.01); *H01L 29/0657* (2013.01); *H01L 29/73* (2013.01)

(58) Field of Classification Search
CPC ....... H01J 49/14; H01J 49/26; H01J 49/4215; H01J 49/408

USPC .......... 250/427, 423 R, 492.1, 282, 290, 294, 250/292; 331/116 M, 154
See application file for complete search history.

(56) References Cited

U.S. PATENT DOCUMENTS 3,328,618 A    6/1967    Wilson
3,588,563 A    6/1971    Schmidt
(Continued)

FOREIGN PATENT DOCUMENTS

CA    2280234 A1    3/2000
CN    1281585 A    1/2001
(Continued)

OTHER PUBLICATIONS

PCT/US2012/043574 International Search Report and Written Opinion mailed Sep. 28, 2012.
(Continued)

*Primary Examiner* — Arnold Kinkead
(74) *Attorney, Agent, or Firm* — Kunzler Law Group

(57) ABSTRACT

An apparatus, system, and method are disclosed for modulating electric current. An electron source electrode provides a flow of electrons in a partial vacuum environment. An ionizable gas in the partial vacuum environment forms positively charged ion particles in response to impact with the electrons from the electron source electrode. Application of a bias voltage differential between a first bias electrode and a second bias electrode in the partial vacuum environment forms an electric field gradient in a path of the flow of electrons. A collector electrode in the partial vacuum environment collects more electrons than ion particles when a collector electrode input voltage is above a threshold, and collects more ion particles than electrons when the collector electrode input voltage is below the threshold.

17 Claims, 9 Drawing Sheets

(51) Int. Cl.
  *H01J 49/26* (2006.01)
  *H01J 49/42* (2006.01)
  *H01J 49/40* (2006.01)
  *H01J 49/14* (2006.01)
  *H01L 29/06* (2006.01)
  *H01L 29/73* (2006.01)

(56) References Cited

U.S. PATENT DOCUMENTS

| | | |
|---|---|---|
| 3,609,469 A | 9/1971 | Feldman |
| 4,437,961 A | 3/1984 | Routh et al. |
| 4,509,451 A | 4/1985 | Collins et al. |
| 4,534,842 A | 8/1985 | Arnal et al. |
| 4,698,233 A | 10/1987 | Ohira et al. |
| 4,960,675 A | 10/1990 | Tsuo et al. |
| 5,041,361 A | 8/1991 | Tsuo |
| 5,102,523 A | 4/1992 | Beisswenger et al. |
| 5,199,918 A | 4/1993 | Kumar |
| 5,203,731 A | 4/1993 | Zimmerman |
| 5,250,388 A | 10/1993 | Schoch, Jr. et al. |
| 5,268,648 A | 12/1993 | Calcatera |
| 5,284,544 A | 2/1994 | Mizutani et al. |
| 5,312,514 A | 5/1994 | Kumar |
| 5,399,238 A | 3/1995 | Kumar |
| 5,502,348 A | 3/1996 | Moyer et al. |
| 5,627,640 A | 5/1997 | Chang et al. |
| 5,628,659 A | 5/1997 | Xie et al. |
| 5,635,789 A | 6/1997 | Makishima et al. |
| 5,711,889 A | 1/1998 | Buchsbaum |
| 5,935,639 A | 8/1999 | Sullivan et al. |
| 5,996,168 A | 12/1999 | Watkins |
| 6,004,830 A | 12/1999 | Potter |
| 6,020,677 A | 2/2000 | Blanchet-Fincher et al. |
| 6,064,137 A | 5/2000 | Cox |
| 6,132,278 A | 10/2000 | Kang et al. |
| 6,140,655 A | 10/2000 | Russell et al. |
| 6,168,737 B1 | 1/2001 | Poco et al. |
| 6,193,870 B1 | 2/2001 | Morse et al. |
| 6,250,540 B1 | 6/2001 | Egitto et al. |
| 6,250,994 B1 | 6/2001 | Chopra et al. |
| 6,313,017 B1 | 11/2001 | Varhue |
| 6,319,655 B1 | 11/2001 | Wong et al. |
| 6,340,556 B1 | 1/2002 | Wong |
| 6,407,399 B1 | 6/2002 | Livesay |
| 6,409,567 B1 | 6/2002 | Amey, Jr. et al. |
| 6,444,256 B1 | 9/2002 | Musket et al. |
| 6,465,954 B1 | 10/2002 | Kerslick et al. |
| 6,514,112 B1 | 2/2003 | Amey, Jr. et al. |
| 6,514,866 B2 | 2/2003 | Russell et al. |
| 6,554,950 B2 | 4/2003 | van Mast |
| 6,565,403 B1 | 5/2003 | Amey, Jr. et al. |
| 6,569,249 B1 | 5/2003 | Singh et al. |
| 6,627,363 B1 | 9/2003 | Wen et al. |
| 6,630,772 B1 | 10/2003 | Bower et al. |
| 6,645,872 B2 | 11/2003 | Russell et al. |
| 6,652,365 B2 | 11/2003 | Chopra et al. |
| 6,672,946 B2 | 1/2004 | Chopra et al. |
| 6,696,220 B2 | 2/2004 | Bailey et al. |
| 6,858,909 B2 | 2/2005 | Cyrille et al. |
| 6,939,434 B2 | 9/2005 | Collins et al. |
| 6,953,982 B1 | 10/2005 | Tai et al. |
| 6,958,093 B2 | 10/2005 | Vaudo et al. |
| 6,964,602 B2 | 11/2005 | Chopra et al. |
| 6,969,625 B2 | 11/2005 | Cyrille et al. |
| 6,977,527 B1 | 12/2005 | Hyde |
| 6,985,378 B2 | 1/2006 | Kozicki |
| 7,033,674 B2 | 4/2006 | Thorp et al. |
| 7,095,038 B2 | 8/2006 | Barthod et al. |
| 7,132,673 B2 | 11/2006 | Fischione et al. |
| 7,277,770 B2 | 10/2007 | Huang |
| 7,297,627 B2 | 11/2007 | Shah et al. |
| 7,352,187 B2 | 4/2008 | Knapp et al. |
| 7,465,945 B2 | 12/2008 | Tokuda et al. |
| 7,586,093 B2 | 9/2009 | Feuerbaum |
| 7,704,306 B2 | 4/2010 | Chen et al. |
| 7,772,564 B2 | 8/2010 | Kruit et al. |
| 7,781,328 B2 | 8/2010 | Shah et al. |
| 7,879,410 B2 | 2/2011 | Che et al. |
| 7,919,722 B2 | 4/2011 | Ryabova et al. |
| 2001/0015604 A1 | 8/2001 | Kerslick et al. |
| 2002/0053353 A1 | 5/2002 | Kawata et al. |
| 2002/0068201 A1 | 6/2002 | Vaudo et al. |
| 2002/0094664 A1 | 7/2002 | Mast |
| 2002/0094694 A1 | 7/2002 | Russell et al. |
| 2002/0185947 A1 | 12/2002 | Schulte et al. |
| 2002/0186017 A1 | 12/2002 | Liebeskind |
| 2003/0060048 A1 | 3/2003 | Russell et al. |
| 2003/0068961 A1 | 4/2003 | Chopra et al. |
| 2003/0073389 A1 | 4/2003 | Chopra et al. |
| 2003/0073390 A1 | 4/2003 | Chopra et al. |
| 2003/0081722 A1 | 5/2003 | Kandaka et al. |
| 2003/0137869 A1 | 7/2003 | Kozicki |
| 2003/0215723 A1 | 11/2003 | Bearinger et al. |
| 2003/0226641 A1 | 12/2003 | Collins et al. |
| 2004/0056249 A1 | 3/2004 | Russell et al. |
| 2004/0106295 A1 | 6/2004 | Cyrille et al. |
| 2004/0137158 A1 | 7/2004 | Kools et al. |
| 2004/0171235 A1 | 9/2004 | Snowdon et al. |
| 2004/0180224 A1 | 9/2004 | Thorp et al. |
| 2004/0191423 A1 | 9/2004 | Ruan et al. |
| 2004/0192176 A1 | 9/2004 | Chopra et al. |
| 2004/0212076 A1 | 10/2004 | Shah et al. |
| 2005/0015175 A1 | 1/2005 | Huang |
| 2005/0041341 A1 | 2/2005 | Cyrille et al. |
| 2005/0045867 A1 | 3/2005 | Ozkan et al. |
| 2005/0072942 A1 | 4/2005 | Barthod et al. |
| 2005/0077811 A1 | 4/2005 | Sun et al. |
| 2005/0211171 A1 | 9/2005 | Hanawa et al. |
| 2006/0001064 A1 | 1/2006 | Hill et al. |
| 2006/0022148 A1 | 2/2006 | Fischione et al. |
| 2006/0083896 A1 | 4/2006 | McKinnell et al. |
| 2006/0124958 A1 | 6/2006 | Cox et al. |
| 2006/0199016 A1 | 9/2006 | Thorp et al. |
| 2006/0202701 A1 | 9/2006 | Knapp et al. |
| 2006/0216952 A1 | 9/2006 | Bhanap et al. |
| 2006/0219546 A1 | 10/2006 | Jan et al. |
| 2007/0023890 A1 | 2/2007 | Haluzak et al. |
| 2007/0057182 A1 | 3/2007 | Feuerbaum |
| 2007/0181831 A1 | 8/2007 | Tokuda et al. |
| 2007/0215841 A1 | 9/2007 | Ford et al. |
| 2007/0259465 A1 | 11/2007 | Gorrell |
| 2007/0280848 A1 | 12/2007 | Narayan et al. |
| 2008/0026592 A1 | 1/2008 | Shah et al. |
| 2008/0090414 A1 | 4/2008 | Chen et al. |
| 2008/0203380 A1 | 8/2008 | Wang et al. |
| 2008/0211401 A1 | 9/2008 | Nakada et al. |
| 2008/0284039 A1 | 11/2008 | Colburn et al. |
| 2008/0304522 A1 | 12/2008 | Mills |
| 2009/0115305 A1 | 5/2009 | Segal et al. |
| 2009/0142656 A1 | 6/2009 | Nathan et al. |
| 2009/0256070 A1 | 10/2009 | Nagano et al. |
| 2010/0072358 A1* | 3/2010 | Jackson ............... 250/282 |
| 2010/0093171 A1 | 4/2010 | Zhang et al. |
| 2010/0193912 A1 | 8/2010 | Speakman |
| 2010/0194237 A1 | 8/2010 | Harvey et al. |
| 2010/0197082 A1 | 8/2010 | Greenberg et al. |
| 2010/0289099 A1 | 11/2010 | Gorrell |
| 2011/0006204 A1* | 1/2011 | Bower et al. ............ 250/298 |
| 2011/0114848 A1 | 5/2011 | Frank et al. |
| 2012/0112056 A1* | 5/2012 | Brucker et al. ......... 250/282 |

FOREIGN PATENT DOCUMENTS

| | | |
|---|---|---|
| CN | 1281587 A | 1/2001 |
| CN | 1328344 A | 12/2001 |
| CN | 1505098 A | 6/2004 |
| CN | 1531668 A | 9/2004 |
| CN | 1765736 A | 5/2006 |
| CN | 2870088 Y | 2/2007 |
| CN | 1953935 A | 4/2007 |
| CN | 101133308 A | 2/2008 |
| CN | 201106064 Y | 8/2008 |
| CN | 101280430 A | 10/2008 |

(56) References Cited

FOREIGN PATENT DOCUMENTS

| | | |
|---|---|---|
| CN | 101359761 A | 2/2009 |
| CN | 101427415 A | 5/2009 |
| CN | 101706549 A | 5/2010 |
| DE | 227829 A1 | 9/1985 |
| EP | 0443154 | 8/1991 |
| EP | 0452950 | 10/1991 |
| EP | 0564926 | 10/1993 |
| EP | 0660362 | 5/1994 |
| EP | 0623950 | 11/1994 |
| EP | 0938739 | 9/1999 |
| EP | 0957512 | 11/1999 |
| EP | 0989579 | 3/2000 |
| EP | 1040501 | 10/2000 |
| EP | 1040502 | 10/2000 |
| EP | 1116256 | 7/2001 |
| EP | 1211918 | 6/2002 |
| EP | 1238314 | 9/2002 |
| EP | 1263025 | 12/2002 |
| EP | 1267153 | 12/2002 |
| EP | 1267385 | 12/2002 |
| EP | 1291680 | 3/2003 |
| EP | 1309650 | 5/2003 |
| EP | 1352295 | 10/2003 |
| EP | 1473560 | 11/2004 |
| EP | 1528846 | 5/2005 |
| EP | 1623443 | 2/2006 |
| EP | 1698878 | 9/2006 |
| EP | 1744988 | 1/2007 |
| EP | 1769545 | 4/2007 |
| EP | 1803140 | 7/2007 |
| EP | 1840649 | 10/2007 |
| EP | 1853890 | 11/2007 |
| EP | 1921053 | 5/2008 |
| EP | 2043131 | 4/2009 |
| EP | 2087536 | 8/2009 |
| EP | 2306242 | 4/2011 |
| FR | 2547692 A1 | 12/1984 |
| FR | 2646491 A1 | 11/1990 |
| FR | 2941878 A1 | 8/2010 |
| JP | 55123124 A | 9/1980 |
| JP | 61295371 A | 12/1986 |
| JP | 3240279 A | 10/1991 |
| JP | 5217833 A | 8/1993 |
| JP | 5307930 A | 11/1993 |
| JP | 0794081 A | 4/1995 |
| JP | 7220644 A | 8/1995 |
| JP | 11154458 A | 6/1999 |
| JP | 2000141056 A | 5/2000 |
| JP | 2001503912 A | 3/2001 |
| JP | 2001135264 A | 5/2001 |
| JP | 3183122 B2 | 7/2001 |
| JP | 2002509338 A | 3/2002 |
| JP | 2002509339 A | 3/2002 |
| JP | 2003021567 A | 1/2003 |
| JP | 2003502698 A | 1/2003 |
| JP | 2003100250 A | 4/2003 |
| JP | 2004186673 A | 7/2004 |
| JP | 2004523906 A | 8/2004 |
| JP | 2005097111 A | 4/2005 |
| JP | 2005350763 A | 12/2005 |
| JP | 2006525633 A | 11/2006 |
| JP | 2007251126 A | 9/2007 |
| JP | 2007287699 A | 11/2007 |
| JP | 4021889 B2 | 12/2007 |
| JP | 2008500933 A | 1/2008 |
| JP | 4047794 B2 | 2/2008 |
| JP | 2008505434 A | 2/2008 |
| JP | 2008508684 A | 3/2008 |
| JP | 2008537998 A | 10/2008 |
| JP | 4467857 B2 | 5/2010 |
| KR | 20000023347 A | 4/2000 |
| KR | 20020095105 A | 12/2002 |
| KR | 20060017775 A | 2/2006 |
| KR | 20070012854 A | 1/2007 |
| KR | 20070115933 A | 12/2007 |
| RU | 2034362 C1 | 4/1995 |
| RU | 2120681 C1 | 10/1998 |
| RU | 2153733 C1 | 7/2000 |
| RU | 2157061 C1 | 9/2000 |
| SU | 563826 A1 | 3/1978 |
| SU | 964786 A1 | 10/1982 |
| SU | 1583994 A1 | 8/1990 |
| SU | 1655929 A1 | 6/1991 |
| SU | 1657991 A1 | 6/1991 |
| SU | 1756972 A1 | 8/1992 |
| TW | 418417 B | 1/2001 |
| TW | 423013 B | 2/2001 |
| TW | 1234191 B | 6/2005 |
| TW | 1247975 B | 1/2006 |
| TW | 200639385 A | 11/2006 |
| TW | 200835804 A | 9/2008 |
| UA | 76257 C2 | 1/2006 |
| WO | 8500142 A1 | 1/1985 |
| WO | 8910254 A1 | 11/1989 |
| WO | 9109646 A1 | 7/1991 |
| WO | 9202030 A1 | 2/1992 |
| WO | 9425976 A1 | 11/1994 |
| WO | 9715069 A1 | 4/1997 |
| WO | 9722731 A1 | 6/1997 |
| WO | 9821736 A1 | 5/1998 |
| WO | 9901592 A1 | 1/1999 |
| WO | 9931700 A1 | 6/1999 |
| WO | 9931701 A1 | 6/1999 |
| WO | 9940604 A1 | 8/1999 |
| WO | 9951357 A1 | 10/1999 |
| WO | 0010643 A1 | 3/2000 |
| WO | 0037206 A2 | 6/2000 |
| WO | 0044038 A1 | 7/2000 |
| WO | 0077577 A1 | 12/2000 |
| WO | 0108193 A1 | 2/2001 |
| WO | 0124217 A1 | 4/2001 |
| WO | 0222711 A2 | 3/2002 |
| WO | 02063661 A2 | 8/2002 |
| WO | 03032392 A2 | 4/2003 |
| WO | 03046255 A1 | 6/2003 |
| WO | 03100818 A1 | 12/2003 |
| WO | 03105182 A2 | 12/2003 |
| WO | 2004010229 A1 | 1/2004 |
| WO | 2004039132 A2 | 3/2004 |
| WO | 2004097378 A1 | 4/2004 |
| WO | 2004048285 A1 | 6/2004 |
| WO | 2004100201 A2 | 11/2004 |
| WO | 2005049887 A2 | 6/2005 |
| WO | 2006014986 A2 | 7/2005 |
| WO | 2005095263 A2 | 10/2005 |
| WO | 2005101973 A2 | 11/2005 |
| WO | 2005113432 A1 | 12/2005 |
| WO | 2006094687 A1 | 9/2006 |
| WO | 2006097652 A1 | 9/2006 |
| WO | 2006101578 A1 | 9/2006 |
| WO | 2006111766 A2 | 10/2006 |
| WO | 2008048755 A1 | 9/2007 |
| WO | 2007130091 A1 | 11/2007 |
| WO | 2008047144 A1 | 4/2008 |
| WO | 2009005908 A2 | 1/2009 |
| WO | 2009151458 | 12/2009 |
| WO | 2010092297 A1 | 8/2010 |

OTHER PUBLICATIONS

Bower et al., On-Chip Electron-Impact Ion Source Using Carbon Nanotube Field Emitters; Applied Physics Letters 90, 124102, Mar. 20, 2007.

Natarjan et al., High Voltage Microelectromechanical Systems Platform for Fully Integrated, On-Chip, Vacuum Electronic Devices; Applied Physics Letters 92, 224101 Jun. 2, 2008.

Natarjan et al., Simulation and Testing of a Lateral, Microfabricated Electron-Impact Ion Source; Applied Physics Letters 94, 044109, Jan. 30, 2009.

Nicolaescu et al., A Conceptual Design for a Microelectronic Ionization Vacuum Guage; Applied Surface Science 126, 292-302 (1998).

* cited by examiner

BIPOLAR MICROELECTRONIC DEVICE

FIELD OF THE INVENTION

This invention relates to bipolar electronic devices and more particularly relates to bipolar microelectronic devices that manipulate electric current with electron and ion charge carriers.

DESCRIPTION OF THE RELATED ART

Solid-state integrated circuit devices typically include both p-type and n-type semiconductors, utilizing the mobility of both electrons and holes to facilitate bipolar operation and digital logic. Currently, solid-state integrated circuit devices are becoming increasingly ubiquitous in electronic devices from nearly every industry.

Solid-state integrated circuit devices, however, may be damaged or may operate unreliably in extremely high temperature environments, in the presence of radiation, or in other harsh environments. For this reason, solid-state integrated circuit devices often have little or no utility in such environments, limiting the use of digital logic in nuclear power facilities, in space-based applications such as satellites, in high temperature engines, in high temperature materials processing applications, and in other extreme applications.

SUMMARY OF THE INVENTION

From the foregoing discussion, it should be apparent that a need exists for an apparatus, system, and method that modulate electric current providing bipolar operation. Beneficially, such an apparatus, system, and method would operate reliably even in high temperature environments, in the presence of radiation, and the like.

The present invention has been developed in response to the present state of the art, and in particular, in response to the problems and needs in the art that have not yet been fully solved by currently available electronic circuits. Accordingly, the present invention has been developed to provide an apparatus, system, and method for modulating electric current that overcome many or all of the above-discussed shortcomings in the art.

The apparatus to modulate electric current is provided with a plurality of elements configured to functionally execute the necessary steps of modulating electric current. These elements in the described embodiments include an electron source electrode, an ionizable gas, a first bias electrode, a second bias electrode, and a collector electrode. The electron source electrode, the ionizable gas, the first bias electrode, the second bias electrode, and the collector electrode, in one embodiment, are in a partial vacuum environment.

The electron source electrode, in one embodiment, provides a flow of electrons. A positive voltage differential between the electron source electrode and an extraction grid, in certain embodiments, draws the electrons from the electron source electrode to provide the flow of electrons. The electron source electrode, in one embodiment, includes a carbon nanotube field emitter.

The ionizable gas, in one embodiment, forms positively charged ion particles in response to impact with the electrons from the electron source electrode. In one embodiment, the ionizable gas includes a noble gas. In a further embodiment, the ionizable gas includes a quench gas with a lower ionization potential than the noble gas. The noble gas and the quench gas, in certain embodiments, form a Penning mixture.

The first and second bias electrodes, in one embodiment, form an electric field gradient in a path of the flow of electrons. The first and second bias electrodes, in certain embodiments, form the electric field gradient in response to application of a bias voltage differential between the first and second bias electrodes. In one embodiment, the first bias electrode has a positive voltage and the second bias electrode has a negative voltage. In various embodiments, the first bias electrode collects electrons while a collector electrode input voltage is below a threshold and the second bias electrode collects ion particles while the collector electrode input voltage is above the threshold.

In one embodiment, the collector electrode collects more electrons than ion particles when the collector electrode input voltage is above a threshold. Conversely, when the electrode input voltage is below the threshold, in certain embodiments, the collector electrode collects more ion particles than electrons. In a further embodiment, the collector electrode is a split electrode, which includes an input electrode and an output electrode. The input electrode, in one embodiment, receives the collector electrode input voltage, and the output electrode provides an output voltage based on the collected electrons and ion particles.

The output electrode, in a further embodiment, provides a negative output voltage when the collector electrode input voltage is above a threshold, and provides a positive output voltage when the collector electrode input voltage is below the threshold. Over a predefined range of collector electrode input voltages, in certain embodiments, the polarity of the output voltage is inverted from a polarity of the collector electrode input voltage. In one embodiment, the input electrode is a charge modulation grid that is next to the output electrode. The charge modulation grid, in one embodiment, has openings through which electrons and ion particles pass to reach the output electrode.

In one embodiment, the electron source electrode, the first and second bias electrodes, and/or the collector electrode are formed on a micro-electro-mechanical systems ("MEMS") substrate. In a further embodiment, the electron source electrode, the first and second bias electrodes, and/or the collector electrode may include a hinged polysilicon panel that is formed on the MEMS substrate, rotated along a hinged axis away from the MEMS substrate, and locked into place.

A system of the present invention is also presented to modulate electric current. The system may be embodied by a substrate, a sealed packaging forming a partial vacuum environment on the surface of the substrate, and a bipolar microelectronic device on the surface of the substrate in the partial vacuum environment. In particular, the system, in one embodiment, includes one or more additional bipolar microelectronic devices, an electronic device, and several electrical connections of the substrate.

The bipolar microelectronic device, in one embodiment, is substantially similar to the apparatus described above. In one embodiment, the electrical connections of the substrate communicate with the bipolar microelectronic device to provide a collector electrode input voltage to a collector electrode of the bipolar microelectronic device and to receive an output voltage from the collector electrode of the bipolar microelectronic device. In certain embodiments, the additional bipolar microelectronic devices are located on the surface of the substrate in the partial vacuum environment. The bipolar microelectronic devices, in one embodiment, are arranged in a digital logic circuit. In a further embodiment, the substrate, the sealed packaging, and the bipolar microelectronic devices are part of the electronic device.

A method of the present invention is also presented for modulating electric current. The method in the disclosed embodiments substantially includes the steps necessary to carry out the functions presented above with respect to the operation of the described apparatus and system. In one embodiment, the method includes providing, in a partial vacuum environment, a flow of electrons from an electron source. The method, in another embodiment, includes forming ion particles from an ionizable gas in the partial vacuum environment in response to impacting the ionizable gas with the electrons. The ion particles, in one embodiment, have a positive electric charge.

In a further embodiment, the method includes applying a bias voltage differential between first and second bias electrodes in the partial vacuum environment to form an electric field gradient in a path of the flow of electrons. In another embodiment, the method includes collecting more electrons than ion particles at a collector electrode in the partial vacuum environment in response to a collector electrode input voltage being above a threshold. The method, in one embodiment, includes collecting more ion particles than electrons at the collector electrode in the partial vacuum environment in response to the collector electrode input voltage being below the threshold.

In a further embodiment, the method includes providing a positive voltage differential between an extraction grid and the electron source electrode to draw the electrons from the electron source electrode. In one embodiment, the method includes receiving the collector electrode input voltage at an input electrode of the collector electrode. The method, in another embodiment, includes providing an output voltage at an output electrode of the collector electrode based on the collected electrons and ion particles.

In one embodiment, the method includes collecting electrons at the first bias electrode, which has a positive voltage, when the collector electrode input voltage is below the threshold. The method, in another embodiment, includes collecting ion particles at the second bias electrode, which has a negative voltage, when the collector electrode input voltage is above the threshold.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
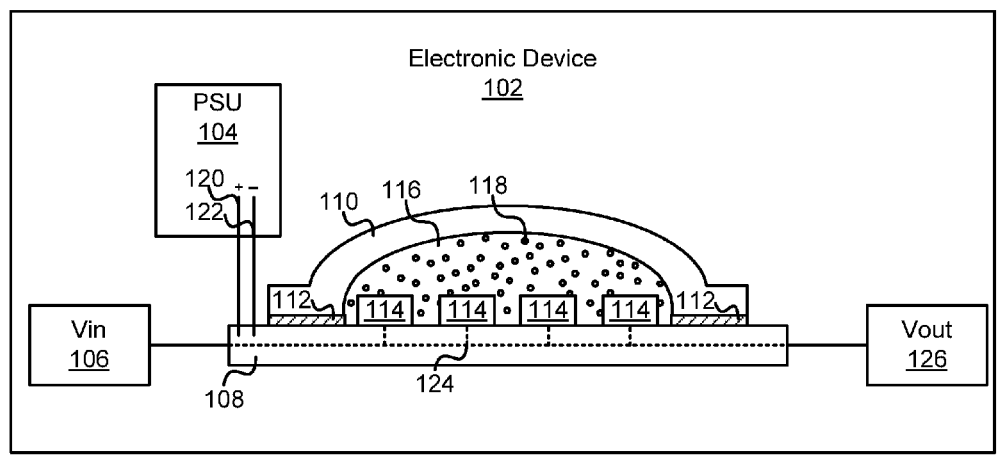
FIG. 1 is a schematic block diagram illustrating one embodiment of a system for modulating electric current in accordance with the present invention.

As will be appreciated by one skilled in the art, aspects of the present invention may be embodied as an apparatus, system, or method. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, wellknown structures, materials, or operations are not shown or described in detail to avoid obscuring aspects of the invention.

Aspects of the present invention are described below with reference to schematic flowchart diagrams and/or schematic block diagrams of methods, apparatuses, and systems according to embodiments of the invention. It will be understood that each block of the schematic flowchart diagrams and/or schematic block diagrams, and combinations of blocks in the schematic flowchart diagrams and/or schematic block diagrams, can be implemented in various mechanical and/or electrical embodiments. These mechanical and/or electrical embodiments create means for implementing the functions/acts specified in the schematic flowchart diagrams and/or schematic block diagrams block or blocks.

The schematic flowchart diagrams and/or schematic block diagrams in the Figures illustrate the architecture, functionality, and operation of possible implementations of apparatuses, systems, and methods according to various embodiments of the present invention. In this regard, each block in the schematic flowchart diagrams and/or schematic block diagrams may represent a module, segment, circuit, or device, which implements the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment.

FIG. 1 depicts one embodiment of a system 100 for modulating electric current. In the depicted embodiment, the system 100 includes an electronic device 102. The electronic device 102, in certain embodiments, may be suited for use in radiation environments, high temperature conditions, or the like, because the electronic device 102 uses vacuum electronics instead of solid state integrated circuits, or the like. The electronic device 102, in a further embodiment, provides bipolar operation, logic circuits, and the like using vacuum electronics by modulating both electrons and ion particles to utilize both positive and negative charge states. For example, by using vacuum electronics, the electronic device 102 may be suitable for use in nuclear power facilities, space-based applications such as satellites, high temperature applications such as engines or materials processing, or the like.

The electronic device 102, in the depicted embodiment, includes a power supply unit ("PSU") 104, an input voltage 106, a substrate 108, a sealed packaging 110 with a seal 112 forming a partial vacuum environment 116, several electronic inverters 114, an ionizable gas 118 within the partial vacuum environment 116, and an output voltage 126. The PSU 104, in the depicted embodiment, provides a positive bias voltage 120 and a negative bias voltage 122 to electrical connections 124 of the substrate 108. The electronic device 102 provides the input voltage 106 to electrical connections 124 of the substrate 108. The electrical connections 124 of the substrate 108 provide the bias voltages 120, 122 and/or the input voltage 106 to the electronic inverters 114, one or more of which provides the output voltage 126 over electrical connections 124 of the substrate 108.

In one embodiment, the substrate 108 is a micro-electro-mechanical systems ("MEMS") platform upon which the electronic inverters 114 are disposed. The substrate 108 and the electronic inverters 114, in certain embodiments, are formed using a polysilicon MEMS microfabricaton process, such as a polysilicon multi-user MEMS processes ("Poly-MUMPS") foundry process, or the like. The substrate 108 may include a silicon-based wafer (or a portion thereof), with one or more metal layers, polysilicon layers, oxide layers, nitride layers, or the like. The electrical connections 124, in certain embodiments, are metal layers disposed on or in the substrate 108.

In one embodiment, the sealed packaging 110 encloses at least a surface of the substrate 108 to form the partial vacuum environment 116 between the sealed packaging 110 and the surface of the substrate 108. The sealed packaging 110, in various embodiments, may include a silicon based film such as a silicon nitride or silicon dioxide film, an organic film, glass, aluminum, or another material forming a cap or lid over the substrate 108. The seal 112 is disposed between the sealed packaging 110 and the substrate 108 to form the partial vacuum environment 116 in a hermetically sealed cavity between the sealed packaging 110 and the substrate 108.

In one embodiment, the partial vacuum environment 116 includes an ionizable gas 118. The partial vacuum environment 116, in certain embodiments, includes few if any other particles other than the ionizable gas 118. The partial vacuum environment 116 may include a low vacuum, medium vacuum, high vacuum, ultra high vacuum, extremely high vacuum, or the like depending on the amount of ionizable gas 118 and/or other gasses present. The ionizable gas 118, in one embodiment, includes a noble gas such as helium, neon, argon, krypton, xenon, radon, or the like.

In a further embodiment, the ionizable gas 118 is a Penning mixture that includes a noble gas and a quench gas, with a lower ionization potential than the included noble gas. The quench gas, in certain embodiments, may also be a noble gas, or may include another gas such as acetylene, trimethylamine, or the like. Examples of Penning mixtures include neon argon mixtures, helium xenon mixtures, neon xenon mixtures, argon xenon mixtures, argon acetylene mixtures, xenon trimethylamine mixtures, and the like. Using a Penning mixture, in certain embodiments, may provide greater efficiency in creating ion particles than using a single noble gas alone.

In one embodiment, an electronic inverter 114 impacts molecules of the ionizable gas 118 with electrons to form positively charged ion particles upon impact. Each electronic inverter 114 is a bipolar microelectronic device that uses both negatively charged electrons and positively charged ion particles. For example, in certain embodiments, an electronic inverter 114 may use both positive and negative charge carriers to invert an input voltage 106 to provide an output voltage 126 with an opposite polarity as the input voltage 106. In other embodiments, the electronic inverters 114 may operate in a different mode other than an inverter mode, such as a transistor mode, or the like. While the input voltage 106 and output voltage 126 are depicted as a single input and output for the substrate 108, in other embodiments, electronic inverters 114 may have individual inputs and/or outputs, with separate input voltages 106 and/or output voltages 126.

The electronic device 102, in certain embodiments, may include additional electronic circuits or the like to process or manipulate one or more input voltages 106 and/or one or more output voltages 126, depending on the function of the electronic device 102. Multiple electronic inverters 114, in one embodiment, may be arranged in a digital logic circuit to perform digital logic functions. Examples of microelectronic structures suitable for use as an electronic inverter 114 are described in greater detail below with regard to FIGS. 2A, 2B, and 4.

Figure 2A:
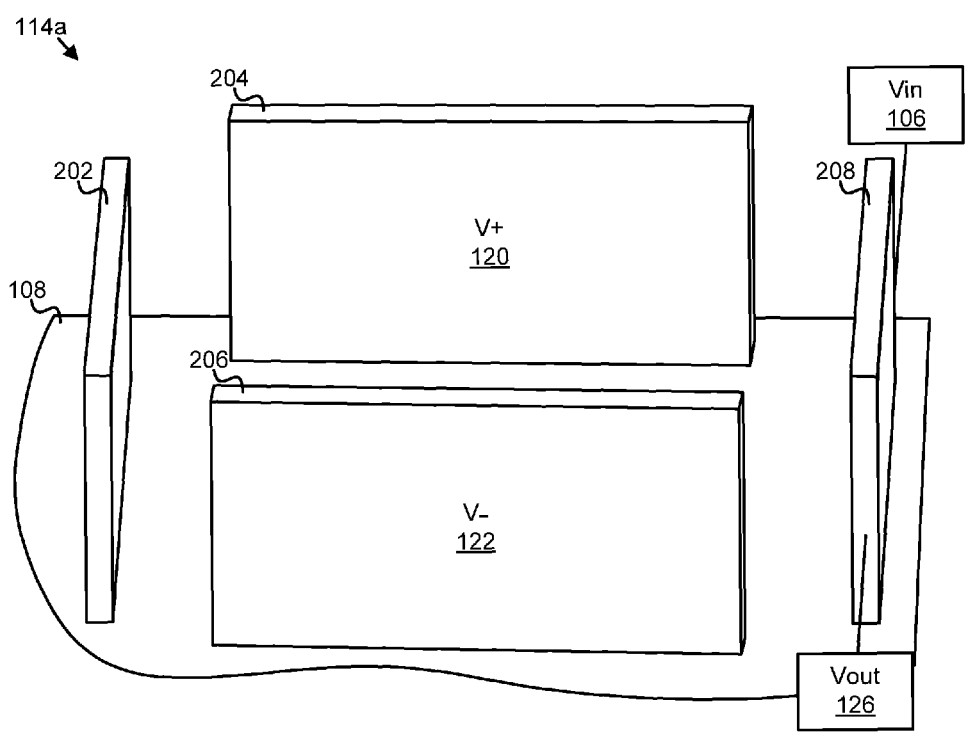
FIG. 2A is a schematic block diagram illustrating one embodiment of a microelectronic inverter in accordance with the present invention.

FIG. 2A depicts one embodiment of a microelectronic inverter 114a. The microelectronic inverter 114a, in certain embodiments, is substantially similar to the electronic inverters 114 described above with regard to FIG. 1. The microelectronic inverter 114a, in the depicted embodiment, includes an electron source electrode 202, a first bias electrode 204, a second bias electrode 206, and a collector electrode 208. The microelectronic inverter 114a is in a partial vacuum environment 116 with an ionizable gas 118 as described above with regard to FIG. 1.

In one embodiment, the electron source electrode 202 provides a flow of electrons for the microelectronic inverter 114a. The electrons flow from the electron source electrode 202 and certain electrons impact molecules of the ionizable gas causing the molecules of the ionizable gas to form positively charged ion particles. As described in greater detail below with regard to the microelectronic inverter 114b of FIG. 2B, one example of an electron source electrode 202 is a carbon nanotube field emitter with an extraction grid that draws electrons from the emitter. The electron source electrode 202, in certain embodiments, is the cathode of the microelectronic inverter 114a.

In one embodiment, the first bias electrode 204 and the second bias electrode 206 form an electric field gradient in a path of the electron flow from the electron source electrode 202. In the depicted embodiment, the first bias electrode 204 receives the positive bias voltage 120 and the second bias electrode 206 receives the negative bias voltage 122, creating a bias voltage differential between the first bias electrode 204 and the second bias electrode 206. The bias voltage differential, in certain embodiments, may be selectively applied to the first bias electrode 204 and the second bias electrode 206.

Depending on the polarity and magnitude of the collector electrode input voltage 106 applied to the collector electrode 208, in certain embodiments, the first bias electrode 204 may collect electrons from the electron source electrode 202 and/or the second bias electrode 206 may collect ion particles. For example, in one embodiment, the first bias electrode 204 collects electrons in response to a collector electrode input voltage 106 being below a threshold and the second bias electrode 206 collects ion particles in response to a collector electrode input voltage 106 being above the threshold, or the like.

In one embodiment, the collector electrode 208 collects electrons from the electron source electrode 202 and collects ion particles from the ionizable gas 118. The microelectronic inverter 114a, in certain embodiments, operates in at least two modes. In a first mode, the collector electrode 208 collects more ion particles than electrons in response to a collector electrode input voltage 106 being below a threshold. In a second mode, the collector electrode 208 collects more electrons than ion particles in response to a collector electrode input voltage 106 being above the threshold. The collector electrode 208, in certain embodiments, is the anode of the microelectronic inverter 114a.

The threshold between operational modes, in one embodiment, is based on various characteristics of the microelectronic inverter 114a, such as the physical positions of the electron source electrode 202, the first bias electrode 204, the second bias electrode 206, and the collector electrode 208; the polarities and magnitudes of the positive bias voltage 120, the negative bias voltage 122, the potential at the electron source electrode 202, and the like; and/or on other physical or electrical characteristics of the microelectronic inverter 114a. The threshold may be a discrete value at which the microelectronic inverter 114a transitions modes, a range of values over which the microelectronic inverter 114a transitions modes, or the like.

The threshold may vary over time depending on conditions of the microelectronic inverter 114a, of the partial vacuum environment 116, and the like. In one embodiment, the threshold is between about −100 volts and 100 volts relative to ground. In a further embodiment, the threshold is between about −50 volts and 50 volts relative to ground. In another embodiment, the threshold is between about −10 volts and 10 volts relative to ground. In an additional embodiment, the threshold is about 0 volts relative to ground.

The electron source electrode 202, the first bias electrode 204, the second bias electrode 206, and the collector electrode 208, in the depicted embodiment, are formed on the substrate 108. In one embodiment that is described in greater detail below with regard to FIG. 4, the substrate 108 is a MEMS substrate, and one or more of the electron source electrode 202, the first bias electrode 204, the second bias electrode 206, and the collector electrode 208 includes a hinged polysilicon panel that is formed on the substrate 108, rotated along a hinged axis away from the substrate 108, and locked into place. While the electrodes 202, 204, 206, 208, in the depicted embodiment, extend vertically from a horizontal substrate 108, in other embodiments, the electrodes 202, 204, 206, 208 may extend horizontally from a vertical substrate or vertical substrate extension, or may have another orientation relative to each other and to the substrate 108.

Further, while the first bias electrode 204 and the second bias electrode 206 are substantially perpendicular to the electron source electrode 202 and the collector electrode 208, which are in parallel, in other embodiments, the electrodes 202, 204, 206, 208 may have different alignments. For example, in various embodiments, the first bias electrode 204 and the second bias electrode 206 may be inverted toward each other, one or more of the electrodes 202, 204, 206, 208 may be askew of another electrode 202, 204, 206, 208, or the like to obtain a desired electrical effect.

In one embodiment, where the electron source electrode 202, the first bias electrode 204, the second bias electrode 206, and the collector electrode 208 are MEMS based devices, one or more of the electron source electrode 202, the first bias electrode 204, the second bias electrode 206, and the collector electrode 208 are less than or equal to about 500 micrometers wide. In a further embodiment, one or more of the electron source electrode 202, the first bias electrode 204, the second bias electrode 206, and the collector electrode 208 are less than or equal to about 250 micrometers wide.

Figure 2B:
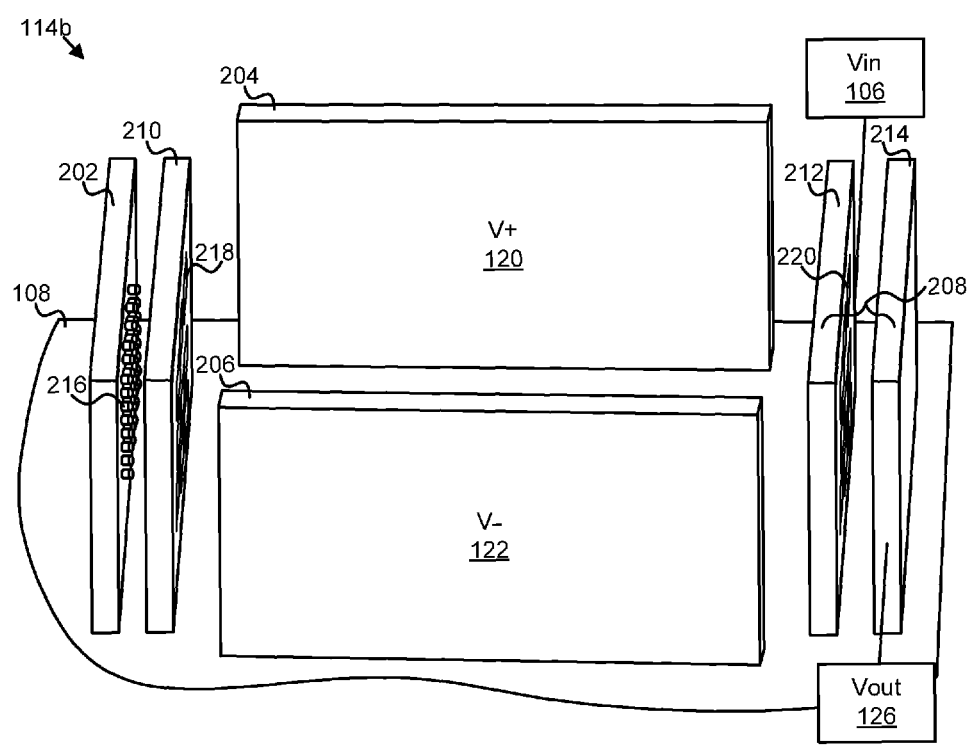
FIG. 2B is a schematic block diagram illustrating another embodiment of a microelectronic inverter in accordance with the present invention.

FIG. 2B depicts another embodiment of a microelectronic inverter 114b. The microelectronic inverter 114b, in the depicted embodiment, is substantially similar to the microelectronic inverter 114a described above with regard to FIG. 2A, but additionally includes an extraction grid 210 next to the electron source electrode 202 and the collector electrode 208 is a split electrode that includes an input electrode 212 and an output electrode 214.

In one embodiment, the extraction grid 210 draws electrons from the electron source electrode 202 when a positive voltage is applied to the extraction grid 210, causing a positive voltage differential between the extraction grid 210 and the electron source electrode 202. The extraction grid 210, in the depicted embodiment, is adjacent to and substantially parallel to the electron source electrode 202 to draw electrons from the electron source electrode 202. In other embodiments, the extraction grid 210 may be disposed in a different position relative to the electron source electrode 202, so that the extraction grid 210 and the electron source electrode 202 are not parallel, are offset from each other, or the like.

The electron source electrode 202, in the depicted embodiment, includes several carbon nanotube field emitters 216 disposed on a surface of the electron source electrode 202. The carbon nanotube field emitters 216 are directed toward the extraction grid 210 so that a positive voltage of the extraction grid 210 draws electrons from the carbon nanotube field emitters 216. In other embodiments, the electron source electrode may provide a flow of electrons using a different type of electron source, using electron optical components, electron permeable membranes, or the like in place of or in conjunction with the carbon nanotube field emitters 216.

The extraction grid 210, as depicted, includes one or more openings 218, through which electrons that the extraction grid 210 draws from the electron source electrode 202 may pass. Upon passing through the extraction grid 210, in the depicted embodiment, the electrons enter the electric field gradient that the first bias electrode 204 and the second bias electrode 206 form.

The collector electrode 208, in the depicted embodiment, is a split electrode that includes the input electrode 212 that receives the collector electrode input voltage 106 and the output electrode 214 that provides the output voltage 126. In the depicted embodiment, the input electrode 212 is a charge modulation grid that includes several openings 220. Depending on the polarity, magnitude, etc. of the collector electrode input voltage 106, electrons, ion particles, or both pass through the openings 220 of the input electrode 212 where the output electrode 214 collects them to provide the output voltage 126.

In the depicted embodiment, the input electrode 212 is disposed adjacent to the output electrode 214 and is substantially parallel to the output electrode 214. In other embodiments, the input electrode 212 may be disposed in a different position relative to the output electrode 214, so that the input electrode 212 and the output electrode 214 are not parallel, are offset from each other, or the like.

In one embodiment, the output electrode 214 provides a negative output voltage 126 in response to the collector electrode input voltage 106 being above a threshold and provides a positive output voltage 126 in response to the collector electrode input voltage 106 being below the threshold. In certain embodiments, a polarity of the output voltage 126 is inverted from a polarity of the collector electrode input voltage 106 over at least a predefined range of collector electrode input voltages 106. In embodiments where the threshold is around about 0 volts, the polarity of the output voltage 126 may be inverted from the polarity of the collector electrode input voltage 106 for substantially any collector electrode input voltage 106.

One of skill in the art, in light of this disclosure, will recognize various voltages that may be supplied to a microelectronic inverter 114. One embodiment of a set of voltages for a microelectronic inverter 114, for example, may include a potential of about −200 volts at the electron source electrode 202, an applied voltage of about 100 volts at the extraction grid 210, an applied voltage of about 100 volts at the first bias electrode 120, an applied voltage of about −200 volts at the second bias electrode 122, and a range of collector electrode input voltages 106 between about −200 volts and 200 volts. In other embodiments, many other voltage magnitudes and polarities may be used.

Figure 3A:
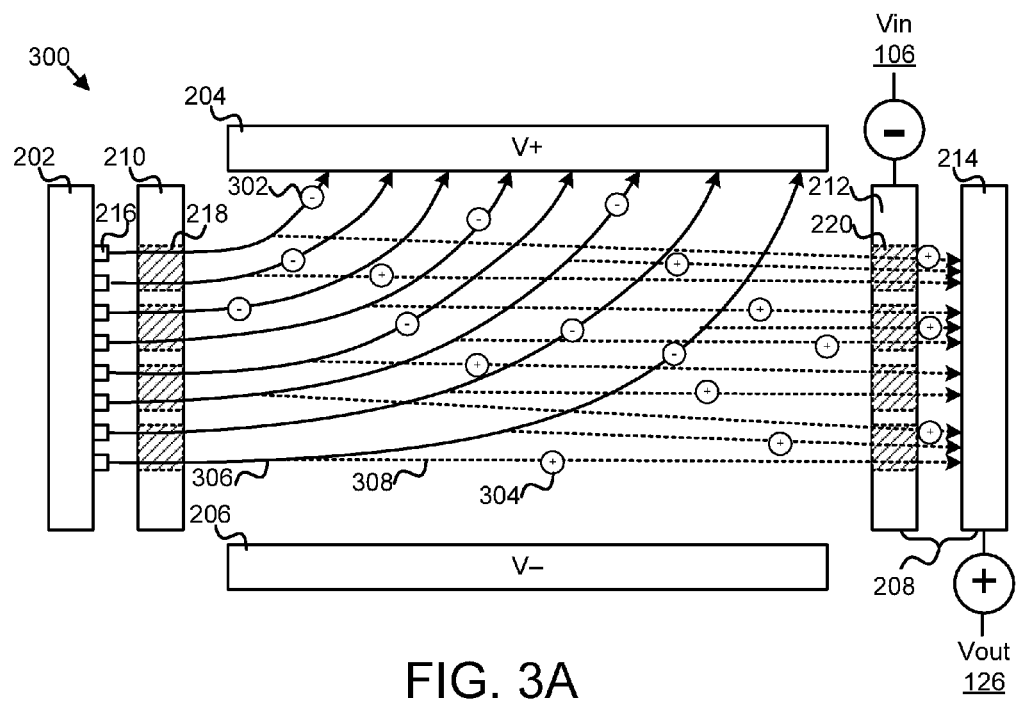
FIG. 3A is a schematic block diagram illustrating one embodiment of a first mode of a microelectronic inverter in accordance with the present invention.

FIG. 3A depicts one embodiment of a first mode 300 of a microelectronic inverter 114.

In the first mode 300, the first bias electrode 204 attracts and collects electrons 302 and the collector electrode 208, including the input electrode 212 and the output electrode 214, attracts and collects ion particles 304. The microelectronic inverter 114, in one embodiment, is in the first mode 300 when the collector electrode input voltage 106 is below a threshold, has a negative polarity, or the like.

In the first mode 300, at least a portion of the electron paths 306 (the solid lines of FIG. 3A) extend from the electron source electrode 202 toward the first bias electrode 204, as the first bias electrode 204 attracts electrons 302. At least a portion of the ion particle paths 308 (the dotted lines of FIG. 3A), in the first mode 300, extend from a point of impact with an electron 302 toward the collector electrode 208, where the ion particles 304 may pass through the input electrode 212 to be collected by the output electrode 214.

Figure 3B:
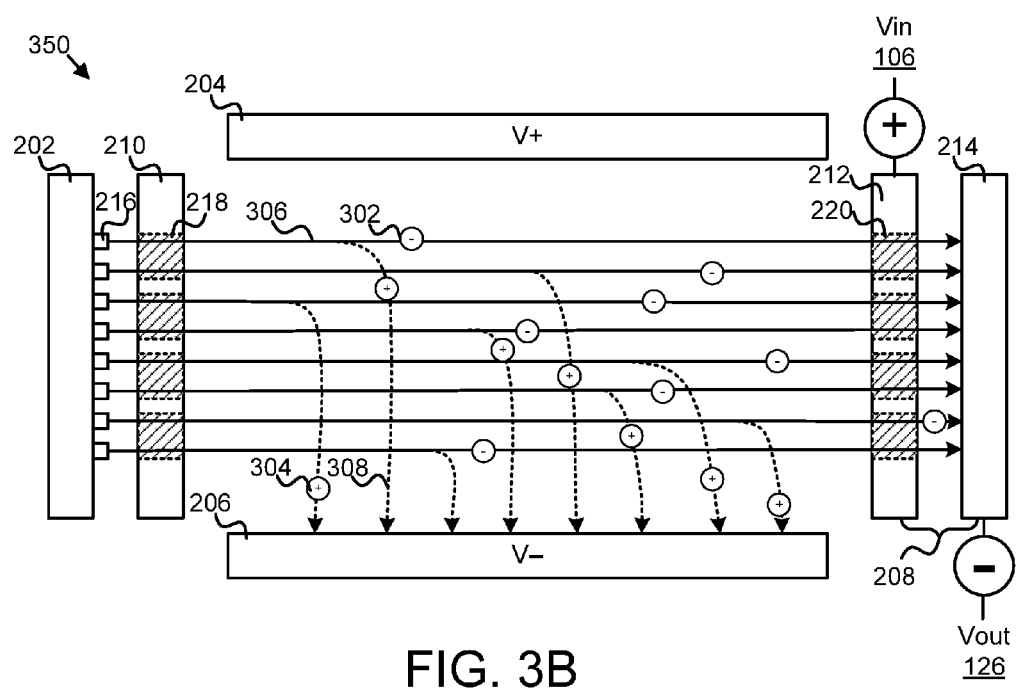
FIG. 3B is a schematic block diagram illustrating one embodiment of a second mode of a microelectronic inverter in accordance with the present invention.

FIG. 3B depicts one embodiment of a second mode 350 of a microelectronic inverter 114. In the second mode 350, the second bias electrode 206 attracts and collects ion particles 304 and the collector electrode 208, including the input electrode 212 and the output electrode 214, attracts and collects electrons 302. The microelectronic inverter 114, in one embodiment, is in the second mode 350 when the collector electrode input voltage 106 is above a threshold, has a positive polarity, or the like.

In the second mode 350, at least a portion of the electron paths 306 (the solid lines of FIG. 3B) extend from the electron source electrode 202 to the collector electrode 208, where the electrons 302 may pass through the input electrode 212 to be collected by the output electrode 214. At least a portion of the ion particle paths 308 (the dotted lines of FIG. 3B), in the second mode 350, extend from a point of impact with an electron 302 toward the second bias electrode 206, as the second bias electrode 206 attracts the ion particles 304.

In between the first mode 300 of FIG. 3A and the second mode of FIG. 3B, as the collector electrode input voltage 106 increases the ratio of ion particles 304 to electrons 302 that the collector electrode 208 collects decreases, transitioning from collecting electric current from the positively charged ion particles 304 in the first mode 300 to collecting electric current from the negatively charged electrons 302 in the second mode 350. While the collector electrode input voltage 106 is at the threshold value, the collector electrode 208 may collect a substantially equal amount of ion particles 304 and electrons 302, may collect substantially no ion particles 304 or electrons 302, or the like.

Figure 4:
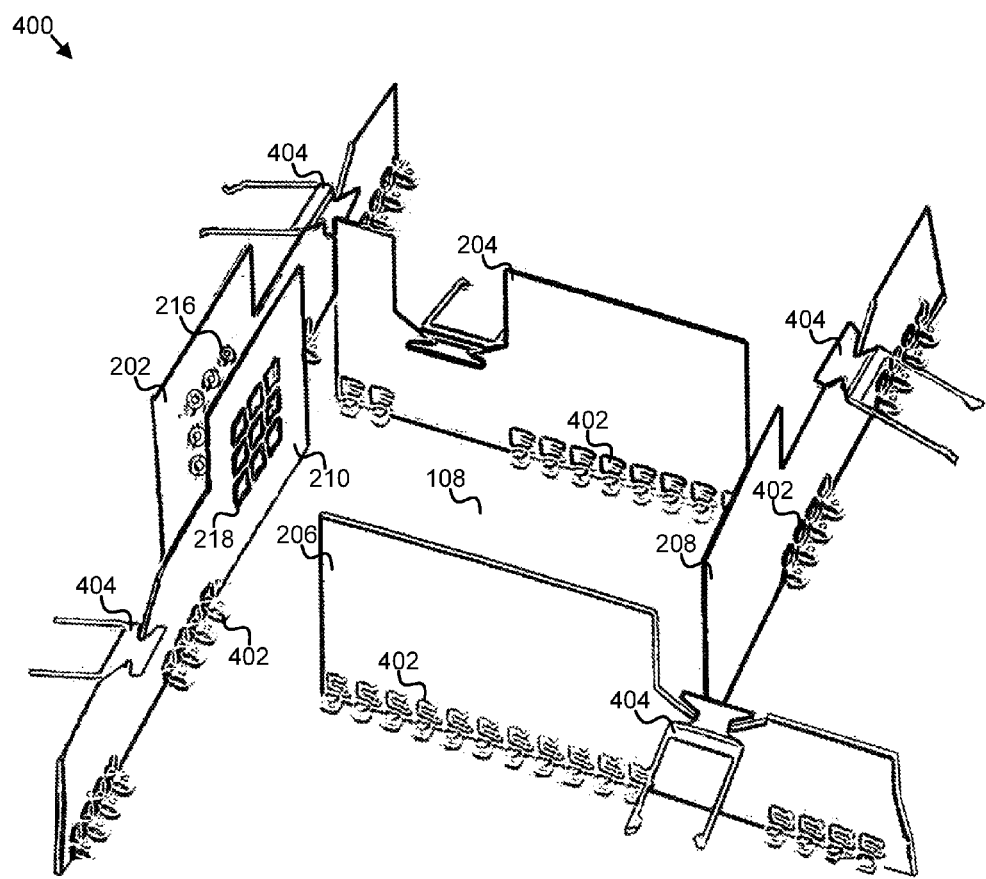
FIG. 4 is a schematic block diagram illustrating an additional embodiment of a microelectronic inverter in accordance with the present invention.

FIG. 4 depicts an additional embodiment of a microelectronic inverter 400. The microelectronic inverter 400 is formed on a MEMS substrate 108. The electron source electrode 202, the extraction grid 210, the first bias electrode 204, the second bias electrode 206, and the collector electrode 208, in the depicted embodiment, each include a hinged polysilicon panel, each with several hinges 402.

In certain embodiments, the electron source electrode 202, the extraction grid 210, the first bias electrode 204, the second bias electrode 206, and/or the collector electrode 208 may be formed on the MEMS substrate 108, rotated along a hinged axis away from the MEMS substrate 108 to stand upright, and locked into place using one or more support structures 404, during a fabrication process, a manufacturing process, or the like. In the depicted embodiment, each support structure 404 engages an opening or notch in an electrode 202, 204, 206, 208, 210 to orient the corresponding electrode 202, 204, 206, 208, 210 with respect to the substrate 108. The carbon nanotube field emitters 216, in certain embodiments, may be grown on the electron source electrode 202 during the fabrication or manufacturing process.

Figure 5:
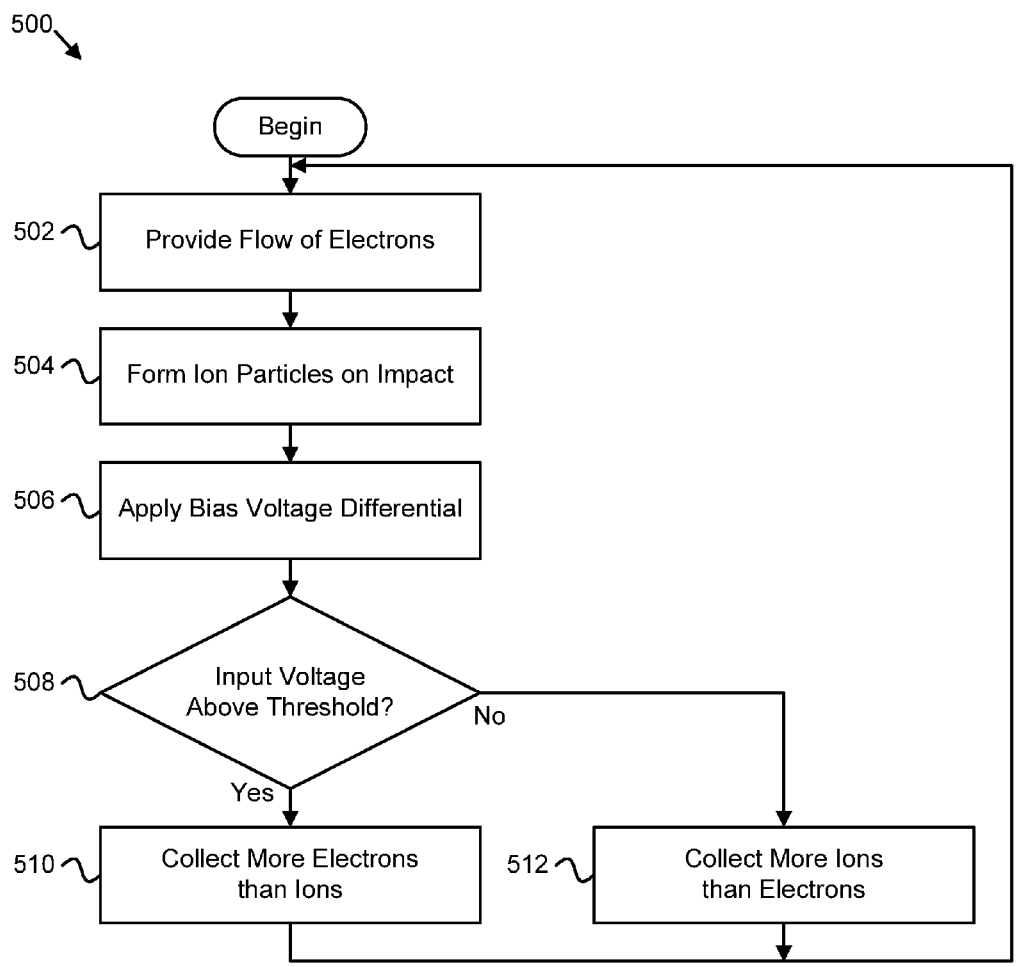
FIG. 5 is a schematic flow chart diagram illustrating one embodiment of a method for modulating electric current in accordance with the present invention.

FIG. 5 depicts one embodiment of a method 500 for modulating electric current. The method 500 begins and the electron source electrode 202 provides 502 a flow of electrons. The electrons 302 cause the ionizable gas 118 to form 504 ion particles 304 upon impact with the electrons 302. The electronic device 102, using the PSU 104 or the like, applies 506 a bias voltage differential between the first bias electrode 204 and the second bias electrode 206, in the path of the electrons 302.

In response to the collector electrode input voltage 106 being 508 above a threshold, the collector electrode 208 collects 510 more electrons 302 than ion particles 304. In response to the collector electrode input voltage 106 being 508 below the threshold, the collector electrode 208 collects 512 more ion particles 304 than electrons 302. The method 500 continues and the electron source electrode 202 continues to provide 502 a flow of electrons. In certain embodiments, the collector electrode input voltage 106 may vary throughout the method 500.

Figure 6:
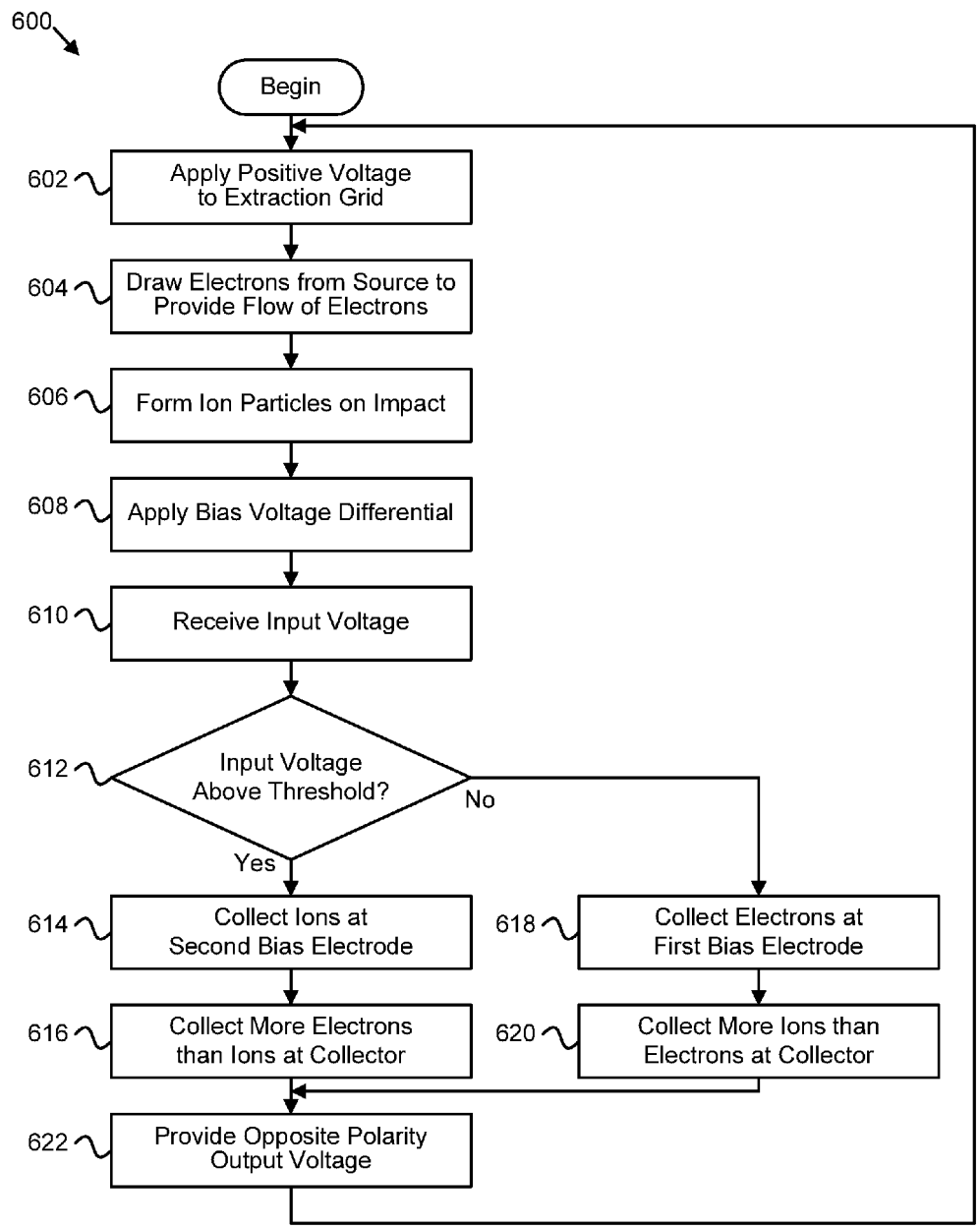
FIG. 6 is a schematic flow chart diagram illustrating another embodiment of a method for modulating electric current in accordance with the present invention.

FIG. 6 depicts another embodiment of a method 600 for modulating electric current.

The method 600 begins and the electronic device 102, using the PSU 104 or the like, applies 602 a positive voltage to the extraction grid 210 to draw 604 electrons 302 from the electron source electrode 202 to provide a flow of electrons. The electrons 302 cause the ionizable gas 118 to form 606 ion particles 304 upon impact with the electrons 302. The electronic device 102, using the PSU 104 or the like, applies 608 a bias voltage differential between the first bias electrode 204 and the second bias electrode 206, in the path of the electrons 302.

The collector electrode 208, at the input electrode 212 or the like, receives 610 the collector electrode input voltage 106. In response to the collector electrode input voltage 106 being 612 above a threshold, the second bias electrode 206 collects 614 ion particles 304, the collector electrode 208 collects 616 more electrons 302 than ion particles 304, and the collector electrode 208, at the output electrode 214 or the like, provides 622 an opposite polarity (i.e. negative) output voltage 126.

In response to the collector electrode input voltage 106 being 612 below the threshold, the first bias electrode 204 collects 618 electrons 302, the collector electrode 208 collects 620 more ion particles 304 than electrons 302, and the collector electrode 208, at the output electrode 214 or the like, provides 622 an opposite polarity (i.e. positive) output voltage 126. The method 600 continues and the electronic device 102, using the PSU 104 or the like, continues to apply 602 a positive voltage to the extraction grid 210, etc.

Figure 7A:
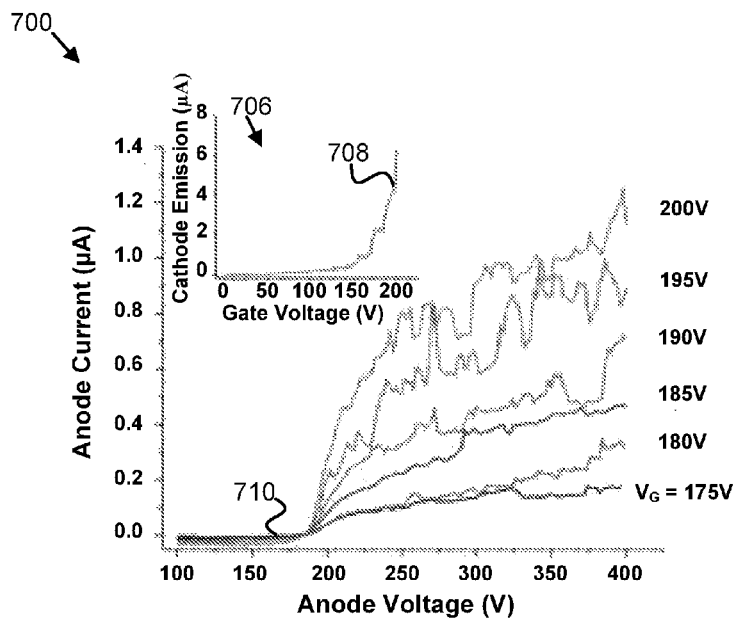
FIG. 7A is a graph illustrating one embodiment of anode current as a function of anode voltage in accordance with the present invention.

FIG. 7A depicts a graph 700, illustrating one example embodiment of electrical current of an anode of an example bipolar microelectronic device, which may be substantially similar to the electronic inverters 114 described above. The anode of the example bipolar microelectronic device, in various embodiments, may be substantially similar to the electrode collector 208 described above. In the depicted graph 700, the anode current is illustrated as a function of anode voltage operated in a vacuum at $7 \times 10^{-7}$ torr.

The curves 710 of the graph 700 illustrate the triode characteristics of a saturated anode current modulated by varying the voltage of a gate. The gate, in various embodiments, may include the extraction grid 210, the input electrode 212, or the like as described above. The example bipolar microelectronic device, in the depicted embodiment, is able to produce currents at the anode in excess of 1 μA. In other embodiments, the anode current may be varied between about 0 and 3 μA, or the like, by adjusting the gate voltage. The inset graph 706 depicts one example embodiment of cathode electron emission as a function of gate voltage. As described above, the electron source electrode 202 may comprise a cathode that emits electrons. In the example graph 706, the extraction grid 210 comprises the gate to which the voltage is applied. In other embodiments, the input electrode 212 may comprise a gate for a bipolar microelectronic device, and a substantially constant voltage may be applied to the extraction grid 210, or the like. In certain embodiments, a bipolar microelectronic device may be able to produce electron currents in excess of about 10 μA or more, with a gate-cathode potential of about 300V, or the like.

Figure 7B:
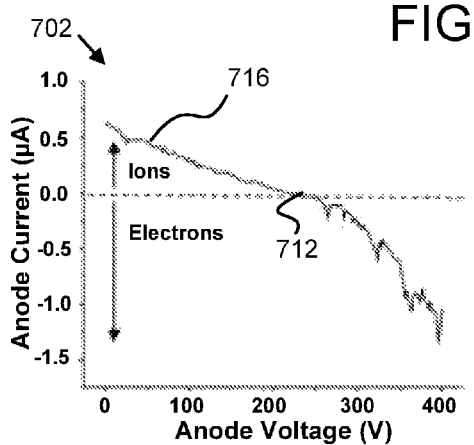
FIG. 7B is a graph illustrating another embodiment of anode current as a function of anode voltage in accordance with the present invention.
Figure 7C:
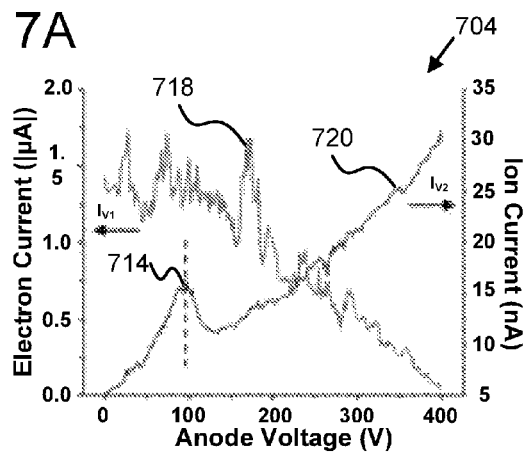
FIG. 7C is a graph illustrating one embodiment of electron current and ion current as a function of anode voltage in accordance with the present invention.

FIGS. 7B and 7C depict graphs 702, 704, of the current-voltage characteristics of a bipolar microelectronic device, as described above, operated at $1 \times 10^{-3}$ torr of Ar. In the depicted embodiment, the anode voltage is swept from 0 to 400 volts while the current is measured at the anode (e.g., the electrode collector 208), at the first bias electrode 204, and at the second bias electrode 206. The current at the anode is depicted as an anode current curve 716, the current at the first bias electrode 204 is depicted as an electron current curve 718, and the current at the second bias electrode 206 is depicted as an ion current curve 720. The graph 702 of FIG. 7B depicts a crossover point 712, i.e. the point at which the anode current is 0. In general, ion current is collected at lower anode voltages (e.g., anode voltages below the crossover point 712) while electron current is collected at higher anode voltages (e.g., anode voltages above the crossover point 712). As the anode switches from collecting ions to collecting electrons at the crossover point 712, the ion current collected at the second bias electrode 206 increases, as depicted by the illustrated ion current curve 720, demonstrating dual charge modulation by controlling the anode voltage.

The graph 704 of FIG. 7C depicts a local maximum 714 in the ion current curve 720, which, in some embodiments, may be reproducible over multiple anode voltage scans. The local maximum 714, in the depicted embodiment, may be a result of the transition from higher ionization efficiency at lower anode voltages to lower ionization efficiency at higher anode voltages. In one embodiment, as the electron trajectories are bent under low anode voltages, the electrons slow down and may pass through a more energetically favorable range (e.g., about 70-100 eV, or the like) for impact ionization. In some embodiments, however, as the voltage increases, the energy may exceed about 100 eV, or the like, and cause the ionization efficiency to decrease as the energy approaches about 400 eV, or the like. Simultaneously, the ion current collection efficiency may increase at the second bias electrode 206 as the electrons are steered away from the anode. This tradeoff may explain the higher ion currents collected at the anode as compared to the second bias electrode 206.

Figure 8:
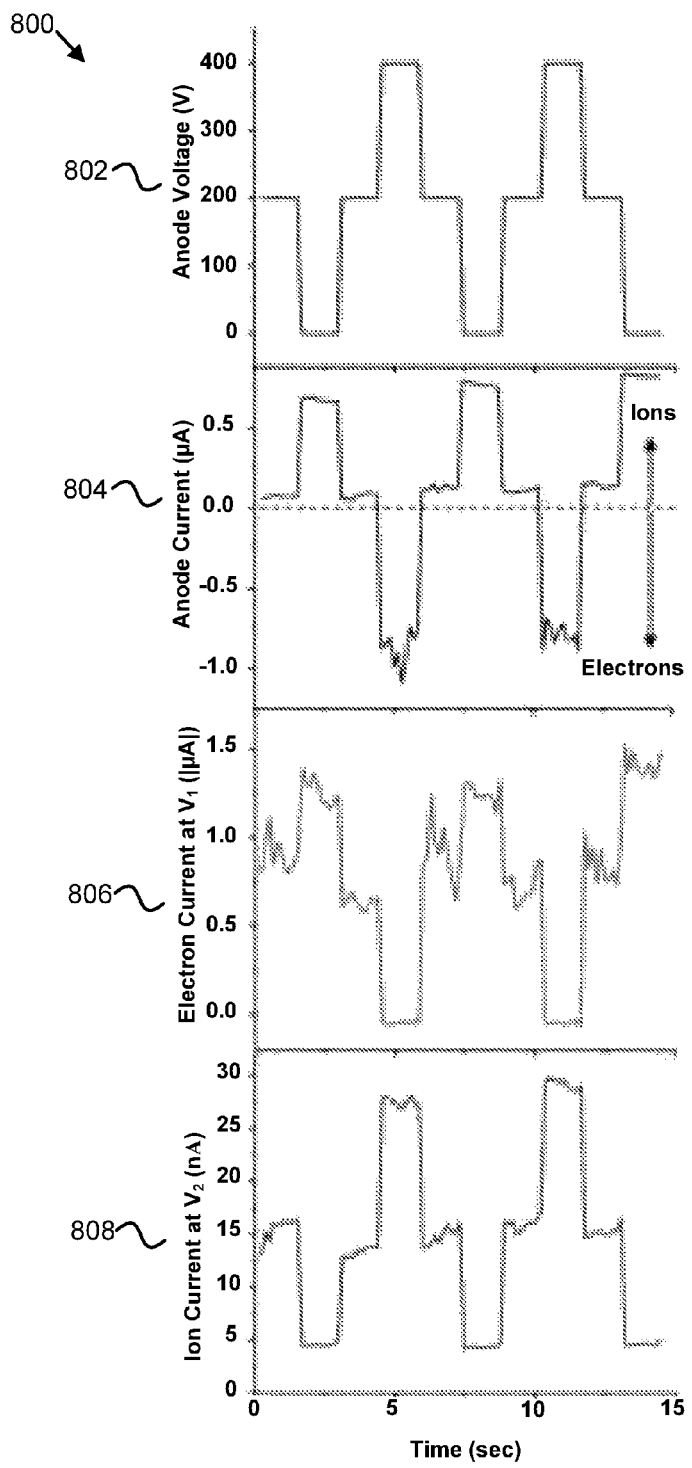
FIG. 8 is a graph illustrating one embodiment of anode voltage, anode current, electron current, and ion current as a function of time in accordance with the present invention.

FIG. 8 depicts one embodiment of a pulse-mode response of a bipolar microelectronic device as described above in response to a pulse train 802 generated at the anode, such as the electrode collector 208. In the depicted embodiment, graph 804 illustrates the current measured at the anode, graph 806 illustrates the current measured at the first bias electrode 204, and graph 808 illustrates the current measured at the second bias electrode 206, all as a function of time. The pulse-mode response of the example bipolar microelectronic device demonstrates bipolar charge modulation at the anode (about 2 mA/cm$^2$ of ion current and about 4 mA/cm$^2$ of electron current). The pulse-mode response of the device provides bipolar logic and even more complex integrated circuitry in vacuum microelectronic devices than provided in traditional systems. In certain embodiments, an integrated modulation grid, coupled with a separate charge collection electrode, enables independent charge switching, as described above with regard to the input electrode 212 and the output electrode 214.

In the example embodiments depicted in FIGS. 7A-7C and FIG. 8, the measured current at the anode is on the order of about 0.5 to 1.5 µA. In other embodiments, higher ionization and total charge densities may be used for certain applications. In further embodiments, increasing the pressure and using a more efficient gas mixture, such as a Penning gas, may improve both charge density and ionization efficiency. Further, the basic bipolar microelectronic device concepts described herein may also operate in a plasma environment, or the like, which may enable higher charge densities than those depicted. In other embodiments, a gaseous discharge may be created in one region of the device while using the control grid to modulate the current in another region, or the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An apparatus to modulate electric current, the apparatus comprising:
    an electron source electrode in a partial vacuum environment, the electron source electrode providing a flow of electrons;
    an ionizable gas in the partial vacuum environment, at least a portion of the ionizable gas forming ion particles in response to impact with the electrons from the electron source electrode, the ion particles having a positive electric charge;
    a first bias electrode and a second bias electrode in the partial vacuum environment, the first and second bias electrodes forming an electric field gradient in a path of the flow of electrons in response to application of a bias voltage differential between the first and second bias electrodes, wherein the first bias electrode has a positive voltage and the second bias electrode has a negative voltage; and
    a collector electrode in the partial vacuum environment, the collector electrode collecting more electrons than ion particles in response to a collector electrode input voltage being above a threshold, and the collector electrode collecting more ion particles than electrons in response to the collector electrode input voltage being below the threshold, wherein the first bias electrode collects at least a portion of the electrons in response to the collector electrode input voltage being below the threshold and the second bias electrode collecting at least a portion of the ion particles in response to the collector electrode input voltage being above the threshold.

2. The apparatus of claim 1, wherein the collector electrode comprises a split electrode, the split electrode comprising an input electrode that receives the collector electrode input voltage and an output electrode that provides an output voltage based on the collected electrons and ion particles.

3. The apparatus of claim 2, wherein the output electrode provides a negative output voltage in response to the collector electrode input voltage being above the threshold and provides a positive output voltage in response to the collector electrode input voltage being below the threshold such that a polarity of the output voltage is inverted from a polarity of the collector electrode input voltage over at least a predefined range of collector electrode input voltages.

4. The apparatus of claim 2, wherein the input electrode comprises a charge modulation grid disposed adjacent to the output electrode, the charge modulation grid comprising one or more openings, the electrons and the ion particles passing through the one or more openings to reach the output electrode.

5. The apparatus of claim 1, further comprising an extraction grid disposed adjacent to the electron source electrode, the extraction grid drawing the electrons from the electron source electrode to provide the flow of electrons in response to a positive voltage differential between the extraction grid and the electron source electrode.

6. The apparatus of claim 5, wherein the electron source electrode comprises a carbon nanotube field emitter.

7. The apparatus of claim 1, wherein the electron source electrode, the first and second bias electrodes, and the collector electrode are formed on a micro-electro-mechanical systems ("MEMS") substrate.

8. The apparatus of claim 7, wherein one or more of the electron source electrode, the first and second bias electrodes, and the collector electrode comprises a hinged polysilicon panel that is formed on the MEMS substrate, rotated along a hinged axis away from the MEMS substrate, and locked into place.

9. The apparatus of claim 1, wherein the ionizable gas comprises a noble gas.

10. The apparatus of claim 9, wherein the ionizable gas further comprises a quench gas with a lower ionization potential than the noble gas, the noble gas and the quench gas forming a Penning mixture.

11. A system to modulate electric current, the system comprising:
    a substrate;
    a sealed packaging enclosing at least a surface of the substrate forming a partial vacuum environment between the sealed packaging and the surface of the substrate;
    a bipolar microelectronic device disposed on the surface of the substrate in the partial vacuum environment, the bipolar microelectronic device comprising,
    an electron source electrode that provides a flow of electrons;
    an ionizable gas in the partial vacuum environment, at least a portion of the ionizable gas forming ion particles in response to impact with the electrons from the electron source electrode, the ion particles having a positive electric charge;
    a first bias electrode and a second bias electrode that form an electric field gradient in a path of the flow of electrons in response to an application of a bias voltage differential between the first and second bias electrodes;
    a collector electrode that collects more electrons than ion particles in response to a collector electrode input voltage being above a threshold and collects more ion particles than electrons in response to the collector electrode input voltage being below the threshold; and
    a plurality of electrical connections of the substrate, the electrical connections in electrical communication with the bipolar microelectronic device to provide the collector electrode input voltage to the collector electrode and to receive an output voltage from the collector electrode.

12. The system of claim 11, further comprising one or more additional bipolar microelectronic devices disposed on the surface of the substrate in the partial vacuum environment.

13. The system of claim 12, wherein the bipolar microelectronic device and the one or more additional bipolar microelectronic devices are arranged in a digital logic circuit.

14. The system of claim 13, further comprising an electronic device comprising the substrate, the sealed packaging, the bipolar microelectronic device, and the one or more additional bipolar microelectronic devices.

15. A method for modulating electric current, the method comprising:
  providing a flow of electrons from an electron source in a partial vacuum environment;
  forming ion particles from an ionizable gas in the partial vacuum environment in response to impacting the ionizable gas with the electrons, the ion particles having a positive electric charge;
  applying a bias voltage differential between first and second bias electrodes in the partial vacuum environment to form an electric field gradient in a path of the flow of electrons;
  collecting more electrons than ion particles at a collector electrode in the partial vacuum environment in response to a collector electrode input voltage being above a threshold;
  collecting at least a portion of the electrons at the first bias electrode in response to the collector electrode input voltage being below the threshold, the first bias electrode having a positive voltage;
  collecting more ion particles than electrons at the collector electrode in the partial vacuum environment in response to the collector electrode input voltage being below the threshold; and
  collecting at least a portion of the ion particles at the second bias electrode in response to the collector electrode input voltage being above the threshold, the second bias electrode having a negative voltage.

16. The method of claim 15, further comprising,
  receiving the collector electrode input voltage at an input electrode of the collector electrode; and
  providing an output voltage at an output electrode of the collector electrode based on the collected electrons and ion particles.

17. The method of claim 15, further comprising providing a positive voltage differential between an extraction grid and the electron source electrode to draw the electrons from the electron source electrode.

* * * * *